(12) United States Patent
Tang et al.

(10) Patent No.: US 11,894,490 B2
(45) Date of Patent: Feb. 6, 2024

(54) SPHERICAL FLIP-CHIP MICRO-LED, METHOD FOR MANUFACTURING THE SAME, AND DISPLAY PANEL

(71) Applicant: CHONGQING KONKA PHOTOELECTRIC TECHNOLOGY RESEARCH INSTITUTE CO., LTD., Chongqing (CN)

(72) Inventors: Biao Tang, Chongqing (CN); Haiping Liu, Chongqing (CN); Zhongshan Feng, Chongqing (CN)

(73) Assignee: CHONGQING KONKA PHOTOELECTRIC TECHNOLOGY RESEARCH INSTITUTE CO., LTD, Chongqing (CN)

( * ) Notice: Subject to any disclaimer, the term of this patent is extended or adjusted under 35 U.S.C. 154(b) by 424 days.

(21) Appl. No.: 17/362,256

(22) Filed: Jun. 29, 2021

(65) Prior Publication Data

US 2021/0376195 A1    Dec. 2, 2021

Related U.S. Application Data

(63) Continuation of application No. PCT/CN2020/091841, filed on May 22, 2020.

(51) Int. Cl.
*H01L 33/38* (2010.01)
*H01L 33/40* (2010.01)
(Continued)

(52) U.S. Cl.
CPC ........ *H01L 33/382* (2013.01); *H01L 25/0753* (2013.01); *H01L 33/005* (2013.01);
(Continued)

(58) Field of Classification Search
CPC . H01L 33/382; H01L 25/0753; H01L 33/005; H01L 33/40; H01L 33/62;
(Continued)

(56) References Cited

U.S. PATENT DOCUMENTS 6,204,545 B1 * 3/2001 Nakata .............. H01L 29/66136
257/466
9,825,202 B2   11/2017 Schuele et al.
(Continued)

FOREIGN PATENT DOCUMENTS

CN    109390437 A    2/2019
CN    109686824 A    4/2019
(Continued)

*Primary Examiner* — J. E. Schoenholtz
(74) *Attorney, Agent, or Firm* — HAUPTMAN HAM, LLP

(57) ABSTRACT

A spherical flip-chip micro-LED, a method for manufacturing the spherical flip-chip micro-LED, and a display panel are provided. The spherical flip-chip micro-LED includes a light-emitting body, a supporting body, a first electrode, a second electrode, and an insulating protective layer. The supporting body is transparent. The first electrode and the second electrode are electrically coupled with the light-emitting body. The insulating protective layer covers the light-emitting body. The light-emitting body, the supporting body, and the insulating protective layer form a spherical structure.

16 Claims, 12 Drawing Sheets

(51) Int. Cl.
   *H01L 33/62*      (2010.01)
   *H01L 33/00*      (2010.01)
   *H01L 25/075*     (2006.01)

(52) U.S. Cl.
   CPC .............. *H01L 33/40* (2013.01); *H01L 33/62* (2013.01); *H01L 2933/0016* (2013.01)

(58) Field of Classification Search
   CPC ............ H01L 2933/0016; H01L 33/46; H01L 33/0093; H01L 33/42; H01L 33/385; H01L 2933/0058; H01L 33/44; H01L 33/58; H01L 33/20; H01L 27/156; H01L 33/14; H01L 33/36; H01L 33/483
   See application file for complete search history.

(56) References Cited

U.S. PATENT DOCUMENTS

| | | | |
|---|---|---|---|
| 2005/0067622 A1* | 3/2005 | Nakata | H01L 31/0352 257/E29.022 |
| 2015/0097204 A1* | 4/2015 | Takada | B32B 38/10 216/49 |
| 2019/0051792 A1* | 2/2019 | Lo | H01L 33/58 |

FOREIGN PATENT DOCUMENTS

| | | | |
|---|---|---|---|
| CN | 109888067 A | 6/2019 | |
| CN | 110556470 A | 12/2019 | |

* cited by examiner

SPHERICAL FLIP-CHIP MICRO-LED, METHOD FOR MANUFACTURING THE SAME, AND DISPLAY PANEL

CROSS-REFERENCE TO RELATED APPLICATIONS

The present application is a continuation of International Application No. PCT/CN2020/091841, filed on May 22, 2020, the disclosure of which is hereby incorporated by reference in its entirety.

TECHNICAL FIELD

This disclosure relates to the fields of display technology and LED technology, and particularly to a spherical flip-chip micro-LED, and a display panel provided with a spherical flip-chip micro-LED, and a method for manufacturing a spherical flip-chip micro-LED.

BACKGROUND

Micro LEDs have higher photoelectric efficiency, higher brightness and contrast, and lower power consumption than general LEDs. In order to realize display function, multiple Micro LEDs are loaded on a backplane to form a micro LED array. Since a size of a single chip of the micro LED is less than 20 μm, it is difficult to manufacturing the micro LED array. Therefore, massive transfer is the key to forming the Micro LED array.

At present, mass transfer technologies mainly include electrostatic transfer, microprinting, and fluidic assembly. During the fluid assembly, a cylindrical brush rolls on the substrate to place the Micro LEDs in a liquid suspension, the Micro LED fall into the corresponding loading wells of the substrate via fluid force. Generally, the Micro LED is a rectangular parallelepiped or cylindrical structure, it is prone to emerge a problem that the Micro LEDs fail to be embedded in the loading wells due to the limitation of such structure.

Thus, in the related art, a spherical LED have been proposed to improve the efficiency of fluidic assembly. However, the thickness of an LED epitaxial layer limits the size of the spherical LED.

SUMMARY

A spherical flip-chip micro-LED, a method for manufacturing the spherical flip-chip micro-LED, and a display panel are provided to address the above technical problems. The spherical flip-chip micro-LED is provided with a supporting body, such that a spherical structure with a set size can be formed, and the normal light emission of the spherical flip-chip micro-LED can be ensured The technical solutions adopted by the disclosure to solve the above technical problems include the following.

A spherical flip-chip micro-LED is provided. The spherical flip-chip micro-LED includes a light-emitting body, a supporting body being transparent, a first electrode and a second electrode which are electrically coupled with the light-emitting body, and an insulating protective layer covering the light-emitting body. The light-emitting body, the supporting body, and the insulating protective layer form a spherical structure.

Compared with the prior art, the technical solution of the disclosure has the following beneficial effects. In addition to the light-emitting body, the transparent supporting body is also provided. The light-emitting body, the supporting body, and the insulating protective layer form a spherical structure with a predetermined size, the normal light emission of the spherical flip-chip micro-LED is also ensured.

In an implementation, the light-emitting body has a density greater than the supporting body.

Advantages according to the technical scheme provided by this implementation of the present disclosure are as follows. The density of the light-emitting body is greater than the density of the supporting body, so that the entire flip-chip micro LED forms a structure similar to a tumbler, which is more conducive to high-efficiency mass transfer.

In an implementation, the light-emitting body includes a first semiconductor layer, a second semiconductor layer, a light-emitting layer sandwiched between the first semiconductor layer and the second semiconductor layer. The first electrode is electrically coupled with the first semiconductor layer, the second electrode is electrically coupled with the second semiconductor layer.

Advantages according to the technical scheme provided by this implementation of the present disclosure are as follows. The first semiconductor layer and the second semiconductor layer release electrons and holes to the light-emitting layer. The electrons and holes recombine in the light-emitting layer and release energy in the form of photons, thereby realizing the light-emitting function.

In an implantation, the light-emitting body further includes an indium tin oxide (ITO) current spreading layer. The ITO current spreading layer is disposed between the second semiconductor layer and the supporting body. The first electrode is electrically connected with the first semiconductor layer, the second electrode is electrically coupled with the second semiconductor layer via the ITO current spreading layer.

Advantages according to the technical scheme provided by this implementation of the present disclosure are as follows. The ITO current spreading layer can increase an actual contact area between the second electrode and the second semiconductor layer, which is conducive to releasing more holes through the second semiconductor layer, thereby improving the luminous efficiency.

In an implementation, the first semiconductor layer, the light-emitting layer, the second semiconductor layer, and the ITO current spreading layer form a hemispherical structure. The supporting body is a hemispherical structure. The first semiconductor layer, the light-emitting layer, and the second semiconductor layer defines an electrode accommodating through hole which extends through and is perpendicular to the first semiconductor layer, the light-emitting layer, and the second semiconductor layer. The second electrode is disposed in the electrode accommodating through hole, and has one end electrically coupled to the ITO current spreading layer and the other end is exposed outside a surface of the hemispherical structure formed by the light-emitting body. An insulating protective layer is covered on outer surfaces of the first semiconductor layer, the light-emitting layer, the second semiconductor layer, and the ITO current spreading layer, and is covered on an inner surface of the electrode accommodating through hole. The insulating protective layer defines an electrode accommodating window thereon. The first electrode is disposed in the electrode accommodating window, and has one end electrically coupled to the first semiconductor layer and the other end is exposed outside the surface of the hemispherical structure formed by the light-emitting body.

Advantages according to the technical scheme provided by this implementation of the present disclosure are as follows. The second electrode is disposed in the receiving through hole to enable the second electrode to be electrically coupled to the ITO current spreading layer. The outer surfaces of the first semiconductor layer, the light-emitting layer, the second semiconductor layer, and the ITO current spreading layer are covered with the insulating protective layer to prevent shorting between the first electrode and the second electrode. The electrode accommodating window is further formed on the insulating protective layer, the first electrode is disposed in the electrode accommodating window to couple to the first semiconductor layer.

In an implementation, an end of the first electrode exposed outside the surface of the hemispherical structure and an end of the second electrode exposed outside the surface of the hemispherical structure are provided with a hot-melt conductive material.

Advantages according to the technical scheme provided by this implementation of the present disclosure are as follows. With the hot-melt conductive material, the electrical connection effect of the spherical flip-chip micro-LED can be effectively improved.

In an implementation, the second electrode is made of a magnetic material, or a part of a surface of the second electrode is coated with a magnetic material.

Advantages according to the technical scheme provided by this implementation of the present disclosure are as follows. The magnetic material makes the second electrode magnetic, which is beneficial to improve the efficiency and accuracy of the mass transfer.

In an implementation, the supporting body is made of $SiO_2$ or transparent solid resin.

Advantages according to the technical scheme provided by this implementation of the present disclosure are as follows. It facilitates the emergence of light.

A method for manufacturing a spherical flip-chip micro-LED includes the following. A light-emitting structure layer and a supporting structure layer are formed sequentially on a substrate. The supporting structure layer is etched into a supporting body, where the supporting body is a hemispherical structure and transparent. The substrate is flipped over and stripped, and the light-emitting structure layer is etched into a hemispherical structure. The hemispherical structure formed by the light-emitting structure layer is perforated to form an electrode accommodating through hole. An insulating protective layer is deposited, and the insulating protective layer is covered on an outer surface of the light-emitting structure layer and an inner surface of the electrode accommodating through hole. The insulating protective layer is etched to form an electrode accommodating window. A first electrode and a second electrode are deposited.

Advantages according to the technical scheme provided by this implementation of the present disclosure are as follows. On the basis of preparing the light-emitting body, the transparent supporting body is also prepared. The light-emitting body, the supporting body, and the insulating protective layer form a spherical structure with a predetermined size, thereby ensuring the normal light emission of the spherical flip-chip micro-LED.

A display panel includes a backplane and a spherical flip-chip micro-LED of any of the implementations described above. The backplane is provided with a first connection wire and a second connection wire. The first electrode of the spherical flip-chip micro-LED is electrically coupled to the first connecting wire, the second electrode of the spherical flip-chip micro-LED is electrically coupled to the second connecting wire.

Advantages according to the technical scheme provided by this implementation of the present disclosure are as follows. In addition to the light-emitting body, the transparent supporting body is also provided on the spherical flip-chip micro-LED. The light-emitting body, the supporting body, and the insulating protective layer form a spherical structure with a predetermined size, the normal light emission of the spherical flip-chip micro-LED is also ensured.

In an implementation, the backplane defines a plurality of loading wells thereon, and each of the plurality of loading wells matches the spherical flip-chip micro-LED and is provided with a magnetic metal pad matching the second electrode therein.

Advantages according to the technical scheme provided by this implementation of the present disclosure are as follows. It facilitates precise alignment of the spherical flip-chip micro-LEDs.

In an implementation, an end of the first electrode exposed outside a surface of the hemispherical structure and an end of the second electrode exposed outside the surface of the hemispherical structure are provided with a hot-melt conductive material. Each of the plurality of loading wells defines a first metal channel corresponding to the first electrode and a second metal channel corresponding to the second electrode, the first electrode is disposed in the first metal channel, and the second electrode is disposed in the second metal channel.

Advantages according to the technical scheme provided by this implementation of the present disclosure are as follows. This facilitates connection and helps optimize the manufacturing process.

In an implementation, the first metal channel has a depth which is less than a thickness of a part of the first electrode which is exposed outside the surface of the hemispherical structure, and greater than a thickness of the hot-melt conductive material on the first electrode. The second metal channel has a depth which is less than a thickness of a part of the second electrode which is exposed outside of the surface of the hemispherical structure, and greater than a thickness of the hot-melt conductive material on the second electrode.

Advantages according to the technical scheme provided by this implementation of the present disclosure are as follows. Effective electrical connection is ensured, the hot-melt conductive material is prevented from overflowing after melting, thereby avoiding short-circuiting.

In an implementation, the first electrode has a plurality of non-continuous protrusions, the first metal channel is a continuous annular metal channel.

Advantages according to the technical scheme provided by this implementation of the present disclosure are as follows. Short-circuiting is further avoided.

In an implementation, the first connection wire and the second connection wire are disposed in the backplane. The first metal channel and the second metal channel are disposed in the loading well. The first connection wire is exposed outside the first metal channel and the second connection wire is exposed outside the second metal channel.

Advantages according to the technical scheme provided by this implementation of the present disclosure are as follows. The electrical connection between the backplane and the spherical flip-chip micro-LED is realized.

Figure 1:
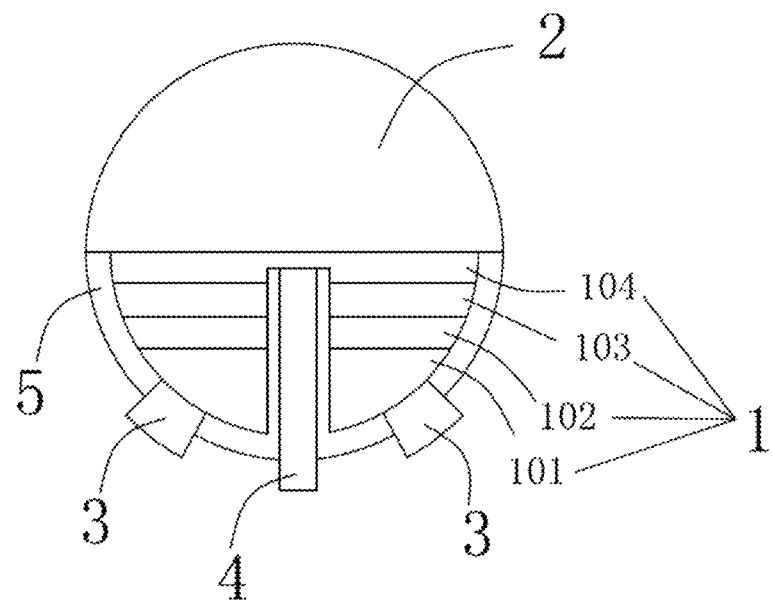
FIG. 1 is a schematic structural diagram of a spherical flip-chip micro-LED of the disclosure.

Reference numbers indicating main members are described as follows:

light-emitting body 1, supporting body 2, first electrode 3, second electrode 4, insulating protective layer 5, substrate 6, backplane 7, bonding material 8, bonding substrate 9, spherical flip-chip micro-LED 10, first semiconductor layer 101, light-emitting layer 102, second semiconductor layer 103, ITO current spreading layer 104, electrode accommodating through hole 105, electrode accommodating window 106, mask layer 107, light-emitting structure layer 108, supporting structure layer 201, loading well 701, first metal channel 702, second metal channel 703, first connection wire 704, second connection wire 705.

DETAILED DESCRIPTION

Objectives, technical solutions, and advantages of the present disclosure will be described clearly and completely hereinafter with reference to the accompanying drawings in the implementations of the present disclosure. It is noted that the implementations described herein are used to merely explain rather than limit the present disclosure.

It is noted that, in the description of the present disclosure, directional terms such as "center", "up", "down", "front", "rear", "left", "right", and the like referred to herein are only for reference to directions illustrated in accompanying drawings. Thus, the directional terms adopted are for describing and understanding the present disclosure better and more clearly, rather than explicitly or implicitly indicate that apparatuses or components referred to herein must have a certain direction or be configured or operated in a certain direction and therefore cannot be understood as limitation on the present disclosure.

It is noted that, in the description of the present disclosure, terms such as "installing", "coupling", "connecting", "interconnect" should be understood in broader sense. For example, coupling may be a fixed coupling, a removable coupling, or an integrated coupling, may be a mechanical coupling or an electrical coupling, and may be a direct coupling, an indirect coupling through a medium, or a communication coupling between two components, unless stated otherwise. When a component is "fixed to" or "disposed on" another component, it can be directly on the other component or indirectly on the other component through a medium. When a component is "connected" to another component, it can be directly connected to the other component or indirectly connected to the other component through a medium. For those of ordinary skill in the art, the above terms in the present disclosure can be understood according to specific situations.

Micro LED is widely concerned by the industry and welcomed by the market because of its outstanding performance. However, a single chip of the micro LED has a size less than 20 μm, which is extremely difficult to manufacture. If the micro LED is produced according to the conventional LED patch method, it will greatly limit production efficiency. Therefore, the mass transfer technology is the key to form the Micro LED array.

Mass transfer refers to a process of transferring a large number of micro LEDs of small size to a substrate to form a micro LED array, and then forming an LED display panel. The conventional LED chip is usually a rectangular parallelepiped or cylindrical structure. During the transfer process, due to its shape, the Micro LED will be stuck outside the loading well, and it is difficult to accurately align with the loading well on the substrate. It is prone to the problem that the Micro LED cannot be embedded in the loading well, the transfer yield and production efficiency are significantly limited. To solve this problem, a spherical LED is provided. By making the LED into a spherical structure, the micro-LED is prevented from getting stuck outside the loading well during the transfer process, and it is convenient to accurately align with the loading well during the transfer process, which can effectively improve the transfer yield and production efficiency and significantly improve the efficiency of mass transfer.

The internal and working principles of spherical LEDs are similar to those of ordinary LEDs. Electrons and holes are emitted through the N-type semiconductor layer and the P-type semiconductor layer, recombined in the light-emitting layer, and release energy in the form of photons to achieve the light-emitting function. This introduces a new problem. The P-type semiconductor layer on an epitaxial structure in the spherical LED is limited by the doping concentration and cannot grow thicker like the N-type semiconductor layer. Therefore, during the production process, the size of the spherical LED depends on the thinner P-type semiconductor layer. It is difficult to form a spherical structure with a predetermined size only by the P-type semiconductor layer and the N-type semiconductor layer, and only a spherical LED with a small radius can be formed. In addition, for a spherical LED formed with only the N-type semiconductor layer, the P-type semiconductor layer, and the light-emitting layer, the thickness of the P-type semiconductor layer is difficult to increase, and a distance between the P-type semiconductor layer and the center of the sphere is relatively large. The light-emitting layer is close to the P-type semiconductor layer, such that a distance between the light-emitting layer and the center of the sphere is relatively large, resulting in a small absolute area of the light-emitting layer, which limits the light-emitting area of the light-emitting layer.

A spherical flip-chip micro-LED, a method for manufacturing the spherical flip-chip micro-LED, and a display panel are provided to address the above problems. A spherical structure with a predetermined size is formed at a very low cost, and the normal light emission of the spherical flip-chip micro-LED is also ensured. The technical solutions in the disclosure will be described in detail below with reference to FIGS. 1 to 23.

It is noted that, generally, according to the internal structure and working mode, LED chips can be divided into normal chip, flip chip, and vertical chip. The micro LEDs of the disclosure are flip-chips, the internal structure of spherical LEDs are improved.

As illustrated in FIG. 1, a spherical flip-chip micro-LED includes a light-emitting body 1, a first electrode 3, a second electrode 4, and an insulating protective layer 5. The first electrode 3 and the second electrode 4 are electrically coupled to the light-emitting body 1. The insulating protective layer 5 covers (completely or partially) a surface of the light-emitting body 1.

The light-emitting body 1 is a main functional structure of the spherical flip-chip micro-LED, and the light-emitting body 1 is used to achieve light emission. The first electrode 3 and the second electrode 4 are used to couple the light-emitting body 1 with an external control signal and/or an external power source. The insulating protective layer 5 is used to prevent shorting between the first electrode 3 and the second electrode 4. Structures of the above identified members can refer to a spherical LED in the related art. The light-emitting principle of the light-emitting body 1 has not been changed in the disclosure, reference can be made to the related art.

In comparison with the related art, the spherical flip-chip micro-LED of the disclosure further includes a supporting body 2, in addition to the light-emitting body 1, the first electrode 3, the second electrode 4, and the insulating protective layer 5. In an implementation, the supporting body 2 is a transparent structure and used for light exiting. As an example, the supporting body 2 is made of $SiO_2$ or a transparent solid resin. Correspondingly, the insulating protective layer 5 covers a surface of the light-emitting body 1 and/or a surface of the supporting body 2. The light-emitting body 1, the supporting body 2, and the insulating protective layer 5 form a spherical structure.

Limited by the doping concentration of the P-type semiconductor layer in the light-emitting body 1, it is difficult to directly epitaxially generate a light-emitting structure layer with sufficient thickness, and it is even more difficult to etch the light-emitting structure layer 108 to obtain a spherical LED chip. Therefore, in addition to the light-emitting body 1 provided to realize the light-emitting function, the disclosure is also creatively provided with the supporting body 2 to make up for the defect that the thickness of the P-type semiconductor layer is difficult to increase through the supporting body 2. On the one hand, the light-emitting body 1 is used to realize the light-emitting function. On the other hand, the supporting body 2, the light-emitting body 1, and the insulating protective layer 5 form a spherical structure with a predetermined size. That is, a complete spherical structure can be formed at a low cost.

As illustrated in FIG. 1, the light-emitting body 1 includes a first semiconductor layer 101, a second semiconductor layer 103, a light-emitting layer 102 sandwiched between the first semiconductor layer 101 and the second semiconductor layer 103. The first electrode 3 is electrically coupled with the first semiconductor layer 101. The second electrode 4 is electrically coupled with the second semiconductor layer 103. In an implementation, the first semiconductor layer 101 is an N-type semiconductor layer. The second semiconductor layer 103 is a P-type semiconductor layer. The first semiconductor layer 101 and the second semiconductor layer 103 release electrons and holes to the light-emitting layer 102. The electrons and holes recombine in the light-emitting layer 102 and release energy in the form of photons, thereby realizing the light-emitting function.

Although a distance between the second semiconductor layer 103 and the center of the sphere is large due to a difficulty in increasing the thickness of the second semiconductor layer 103, the existence of the supporting body 2 allows the light-emitting layer 102, which is adjacent to the second semiconductor layer 103, to be disposed near or located at the center of the sphere, thus make the absolute area of the light-emitting layer 102 small, which is beneficial to increase its light-emitting area.

In an implementation, the light-emitting body 1 has a density greater than the supporting body 2. That is, the density of the supporting structure layer 201 is greater than an overall density of the first semiconductor layer 101, the light-emitting layer 102, the second semiconductor layer 103, and the ITO current spreading layer 104 as a whole. The density of the light-emitting body 1 is greater than the density of the supporting body 2, so that the entire flip-chip micro LED forms a structure similar to a tumbler. As such, the spherical LED can easily maintain a posture with the light-emitting body 1 below and the supporting body 2 above, which is beneficial to allowing a hemisphere with electrodes to fall into the loading well on a backplane during the liquid assembly, thereby improving the yield and transfer efficiency of the liquid assembly. In addition, even if wrong matching occurs during an initial loading, since the density of the light-emitting body 1 is greater than the density of the supporting body 2, the wrongly matched spherical LED chip can be removed from the backplane and repositioned correctly only by vibration, thereby improving the yield.

Figure 21:
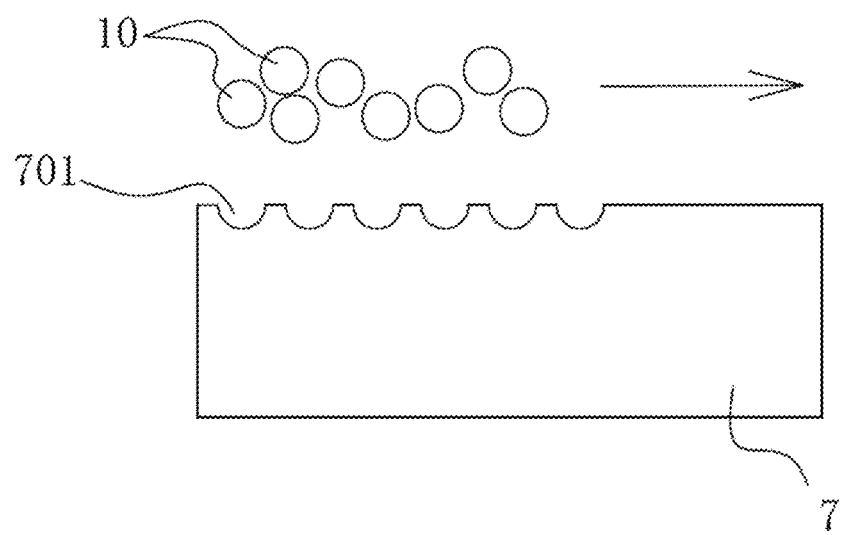
FIG. 21 is a schematic diagram of a suspension obtained during a mass transfer of the disclosure.
Figure 22:
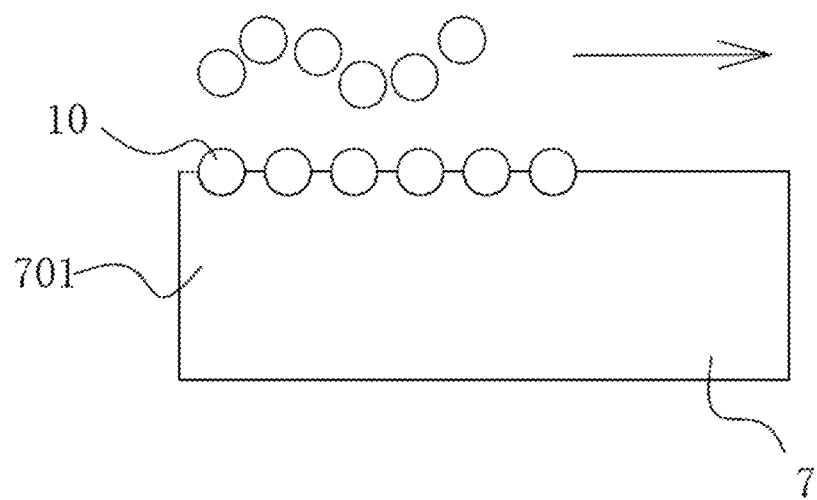
FIG. 22 is a schematic diagram of the spherical flip-chip micro-LEDs falling into loading wells during the mass transfer of the disclosure.

Referring to FIG. 21 and FIG. 22, during assembling a display using the above spherical LED, a more efficient mass transfer can be achieved through fluidic transfer.

When the spherical flip-chip micro-LED falls from the suspension to a surface of the backplane 7, since the density of the light-emitting body 1 is greater than the density of the supporting body 2, the hemispherical structure of the light-emitting body 1 can be maintained in contact with the backplane 7. When the spherical flip-chip micro-LED moves slowly horizontally with the suspension, the hemispherical structure of the light-emitting body 1 of the spherical flip-chip micro-LED is easy to fall into the groove on the backplane 7, which is beneficial to bonding the spherical flip-chip micro-LED to the backplane 7.

In an implementation, the first semiconductor layer 101 is made of n-GaN. The second semiconductor layer 103 is made of p-GaN. The light-emitting layer 102 is made of InGaN or InN. The first electrode 3 is made of ITO. The insulating protective layer 5 is made of silicon dioxide. In addition, the following implementations can also be adopted. The first semiconductor layer 101 is made of one of N-type gallium arsenide or N-type copper phosphide. The second semiconductor layer 103 is made of one of P-type gallium arsenide or P-type copper phosphide. The light-emitting layer 102 is made of one or more of indium gallium aluminum nitride, gallium arsenide, aluminum gallium arsenide, indium gallium phosphide, indium arsenide phosphide, or indium gallium arsenide. The first electrode 3 is made of one or any combination of titanium, aluminum, nickel, and their alloys. It is noted that the above-mentioned materials are only examples, and are not intend to limit the materials of the first semiconductor layer 101, the second semiconductor layer 103, the light-emitting layer 102, the first electrode 3, and the insulating protective layer 5. Other materials that use the same principle to achieve the same function should also be considered to fall within the scope of the implementations of the disclosure, and will not be listed herein.

In order to realize normal light-emitting of the light-emitting body 1, the first electrode 3 needs to be electrically coupled to the first semiconductor layer 101. Similarly, the second electrode 4 needs to be electrically coupled to the second semiconductor layer 103. In the spherical structure, the first semiconductor layer 101 is located at the bottom of the spherical structure, and the second semiconductor layer 103 is located at the middle of the spherical structure. Therefore, it is possible to increase an effective contact area with the first semiconductor layer 101 by arranging multiple first electrodes 3, but it is difficult to increase an effective contact area with the second semiconductor layer 103 by arranging multiple second electrodes 4. It can be seen that the effective contact area of the second semiconductor layer 103 and the second electrode 4 is a factor restricting the luminous efficiency of the spherical flip-chip micro-LED.

As illustrated in FIG. 1, in an implementation, in order to increase the effective contact area of the second semiconductor layer 103 and the second electrode 4, the light-emitting body 1 further includes an indium tin oxide (ITO) current spreading layer 104. The ITO current spreading layer 104 is disposed between the second semiconductor layer 103 and the supporting body 2. The first electrode 3 is electrically connected with the first semiconductor layer 101. The second electrode 4 is electrically coupled with the second semiconductor layer 103 via the ITO current spreading layer 104.

Supposing the second electrode 4 is directly electrically coupled to the second semiconductor layer 103, a connection relationship between the second electrode 4 and the second semiconductor layer 103 is a point-to-surface connection, and the second electrode 4 can only activate holes around a contact point on the second semiconductor layer 103. When the second electrode 4 is electrically coupled to the second semiconductor layer 103 via the ITO current spreading layer 104, a connection relationship between the ITO current spreading layer 104 and the second semiconductor layer 103 is a surface-to-surface connection. The second electrode 4 can theoretically activate all the holes of the entire second semiconductor layer 103 via the ITO current spreading layer 104. In general, the ITO current spreading layer 104 can increase the actual contact area between the second electrode 4 and the second semiconductor layer 103, which is beneficial to release more holes through the second semiconductor layer 103, thereby improving the luminous efficiency.

As illustrated in FIG. 1, as an implementation, the first semiconductor layer 101, the light-emitting layer 102, the second semiconductor layer 103, and the ITO current spreading layer 104 form a hemispherical structure, the supporting body 2 is a hemispherical structure. In order to form the spherical flip-chip micro-LED, the first semiconductor layer 101, the light-emitting layer 102, and the second semiconductor layer 103 defines an electrode accommodating through hole 105 which extends through and is perpendicular to the first semiconductor layer 101, the light-emitting layer 102, and the second semiconductor layer 103. The second electrode 4 is disposed in the electrode accommodating through hole 105, and has one end electrically coupled to the ITO current spreading layer 104 and the other end is exposed outside a surface of the hemispherical structure formed by the light-emitting body.

An insulating protective layer 5 is covered on outer surfaces of the first semiconductor layer 101, the light-emitting layer 102, the second semiconductor layer 103, and the ITO current spreading layer 104, and is covered on an inner surface of the electrode accommodating through hole 105. The insulating protective layer 5 defines an electrode accommodating window 106 thereon. The first electrode 3 is disposed in the electrode accommodating window 106, and has one end electrically coupled to the first semiconductor layer 3 and the other end is exposed outside the surface of the hemispherical structure formed by the light-emitting body. The second electrode 4 is provided in the electrode accommodating through hole 105, such that the second electrode 4 is electrically coupled to the ITO current spreading layer 104. The outer surfaces of the first semiconductor layer 101, the light-emitting layer 102, the second semiconductor layer 103, and ITO current spreading layer 104 are covered with the insulating protective layer 5 to prevent shorting between the first electrode 3 and the second electrode 4. The electrode accommodating window 106 is defined on the insulating protective layer 5. The first electrode 3 is disposed in the electrode accommodating window 106 to couple to the first semiconductor layer 101. As such, the light-emitting body 1 is coupled to an external control signal and/or an external power source via the first electrode 3 and the second electrode 4.

In an implementation, the cross-sectional areas of the first semiconductor layer 101, the light-emitting layer 102, the second semiconductor layer 103, and the ITO current spreading layer 104 increase in sequence. The first semiconductor layer 101, the light-emitting layer 102, the second semiconductor layer 103, and the ITO current spreading layer 104 are close to the supporting body 2 in sequence. As such, it is beneficial to arranging the first electrode 3 and the second electrode 4 and ensuring that the ITO current spreading layer 104 and the second semiconductor layer 103 are in close contact. At the same time, the area of the ITO current spreading layer 104 is greater than the area of the second semiconductor layer 103, which is beneficial to releasing the holes of the second semiconductor layer 103 to the greatest extent, thereby improving the luminous efficiency.

In an implementation, an end of the first electrode 3 exposed outside the surface of the hemispherical structure and an end of the second electrode 4 exposed outside the surface of the hemispherical structure are provided with a hot-melt conductive material. The spherical flip-chip micro-LED needs to be mounted on the backplane to form a display panel to truly realize its function. Therefore, the effective electrical coupling between the spherical flip-chip micro-LED and the backplane is the key. The electrical coupling effect of the spherical flip-chip micro-LED can be effectively improved via the hot-melt conductive material.

In an implementation, the second electrode 4 is made of a magnetic material. Alternatively, a part of a surface of the second electrode 4 is coated with a magnetic material. The magnetic material makes the second electrode 4 magnetic, which is beneficial to improve the efficiency and accuracy of the mass transfer.

In an implementation, the insulating protective layer 5 is provided with a Distributed Bragg Reflection (DBR) structure. The light emitted by cooperation of the first semiconductor layer 101, the light-emitting layer 102 and the second semiconductor layer 103 is directed in various directions, and finally all need to be emitted out via the supporting body 2. Thus, the DBR structure is provided in the insulating protective layer 5 to concentrate the light oriented in various directions toward the supporting body 2, which facilitates the improvement of luminous efficiency. In addition, the spherical light-emitting surface is beneficial to reduce the total reflection inside the spherical flip-chip micro-LED, thus improving the light extraction efficiency. It is noted that the DBR structure is used to reflect light and is formed through an existing technology, which will be appreciated by those skilled in the art.

A method for manufacturing a spherical flip-chip micro-LED is provided. The method includes the following.

A light-emitting structure layer 108 and a supporting structure layer 201 are sequentially formed on a substrate 6. The supporting structure layer 201 is etched into a supporting body 2. The supporting body 2 is a hemispherical structure and transparent. The substrate 6 is flipped over and stripped, and the light-emitting structure layer 108 is etched into a hemispherical structure. The hemispherical structure formed by the light-emitting structure layer 107 is perforated to form an electrode accommodating through hole 105. An insulating protective layer which is covered on an outer surface of the light-emitting structure layer and an inner surface of the electrode accommodating through hole is deposited. The insulating protective layer 5 is etched to form an electrode accommodating window 106. A first electrode 3 is deposited in the electrode accommodating window 106 and a second electrode 4 is deposited in the electrode accommodating through hole 105.

In an implementation, the method for manufacturing the spherical flip-chip micro-LED is provided. The method includes the following.

A first semiconductor layer 101, a light-emitting layer 102, a second semiconductor layer 103, an ITO current spreading layer 104, and a supporting structure layer 201 are sequentially formed on the substrate 6. The first semiconductor layer 101, the light-emitting layer 102, the second semiconductor layer 103, and the ITO current spreading layer 104 form a light-emitting structure layer 108. The light-emitting structure layer 108 and the supporting structure layer 201 are sequentially arranged in a bottom-up process.

The supporting structure layer 201 is etched into the supporting body 2. The supporting body 2 is a hemispherical structure and transparent.

The substrate 6 is flipped over and stripped. The light-emitting structure layer 108 composed of the first semiconductor layer 101, the light-emitting layer 102, the second semiconductor layer 103, and the ITO current spreading layer 104 is etched into the hemispherical structure.

The hemispherical structure formed by the light-emitting structure layer 108 is perforated to form the electrode accommodating through hole 105.

The insulating protective layer 5 is deposited, such that the insulating protective layer 5 is covered on outer surfaces of the first semiconductor layer 101, the light-emitting layer 102, the second semiconductor layer 103, and the ITO current spreading layer 104, and the inner surface of the electrode accommodating through hole 105.

The insulating protective layer 5 is etched on the electrode accommodating window 106. The electrode accommodating window 106 is located at a position corresponding to the first semiconductor layer 101.

The first electrode 3 is deposited in the electrode accommodating window 106, and the second electrode 4 is deposited in the electrode accommodating through hole 105. The first electrode 3 is disposed in the electrode accommodating window 106. One end of the first electrode 3 is electrically coupled to the first semiconductor layer 101, and the other end of the first electrode 3 is exposed outside the hemispherical structure. The second electrode 4 is disposed in the electrode accommodating through hole 105. One end of the second electrode 4 is electrically coupled to the ITO current spreading layer 104, and the other end of the second electrode 4 is exposed outside the hemispherical structure.

Through the above technical solution, in addition to the preparation of the light-emitting body 1, the transparent supporting body 2 is also prepared, such that a complete spherical structure is formed through the light-emitting body 1, the supporting body 2, and the insulating protective layer 5 at a very low cost, and the normal light emission of the spherical flip-chip micro-LED is ensured.

The above method will be described below with reference to FIGS. 2 to 13 in accordance with the production process flow.

Figure 2:
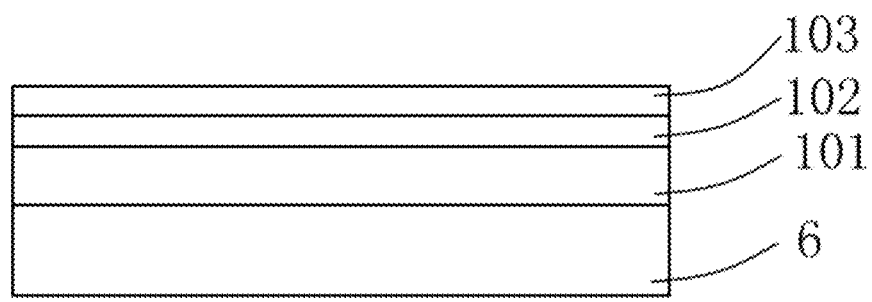
FIG. 2 is a schematic structural diagram of a substrate, a first semiconductor layer, a light-emitting layer, and a second semiconductor layer during performing a method for manufacturing the spherical flip-chip micro-LED of the disclosure.
Figure 3:
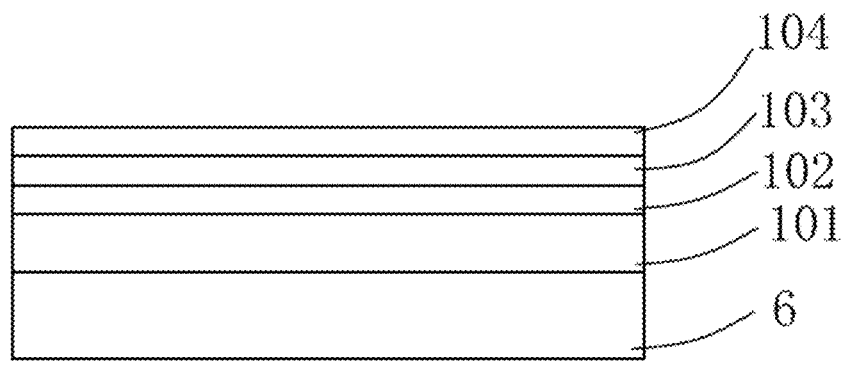
FIG. 3 is a schematic structural diagram of the substrate, the first semiconductor layer, the light-emitting layer, the second semiconductor layer, and an ITO current spreading layer during performing a method for manufacturing the spherical flip-chip micro-LED of the disclosure.
Figure 4:
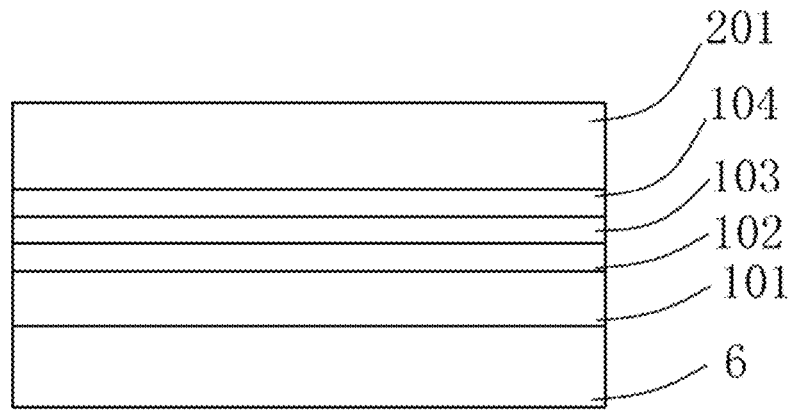
FIG. 4 is a schematic structural diagram of the light-emitting structure layer and the supporting structure layer during performing a method for manufacturing the spherical flip-chip micro-LED of the disclosure.
Figure 5:
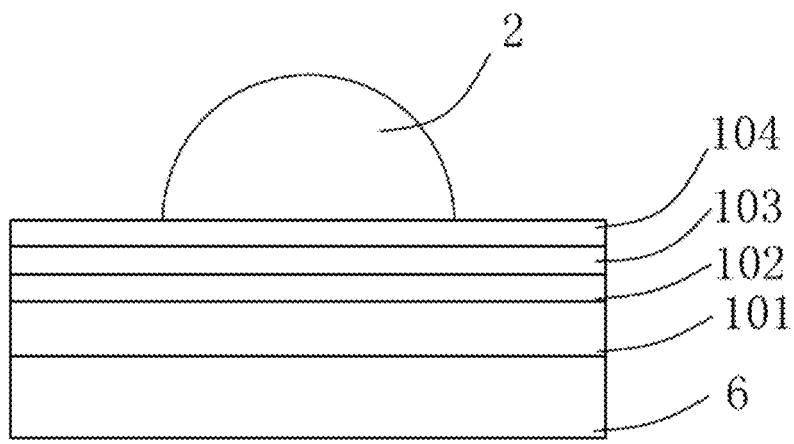
FIG. 5 is a schematic diagram of a hemispherical structure etched on the supporting structure layer during performing a method for manufacturing the spherical flip-chip micro-LED of the disclosure.

As illustrated in FIG. 2, the light-emitting structure layer 108 and the supporting structure layer 201 are first formed on the substrate 6 sequentially. The light-emitting structure layer 108 includes the first semiconductor layer 101, the light-emitting layer 102, the second semiconductor layer 103, and the ITO current spreading layer 104. As illustrated in FIG. 3, the first semiconductor layer 101, the light-emitting layer 102, the second semiconductor layer 103, and the ITO current spreading layer 104 are sequentially formed. As illustrated in FIG. 4, the supporting structure layer 201 is formed on the ITO current spreading layer 104, and the supporting body 2 is a transparent structure. As illustrated in FIG. 5, the supporting body 2 is then etched into a first hemisphere.

Figure 6:
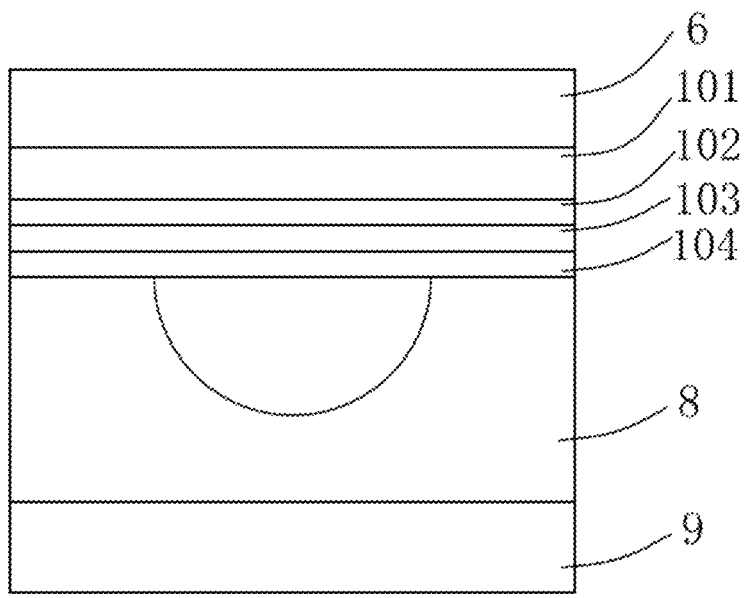
FIG. 6 is a schematic diagram of flipping the light-emitting structure layer and the supporting structure layer during performing a method for manufacturing the spherical flip-chip micro-LED of the disclosure.
Figure 7:
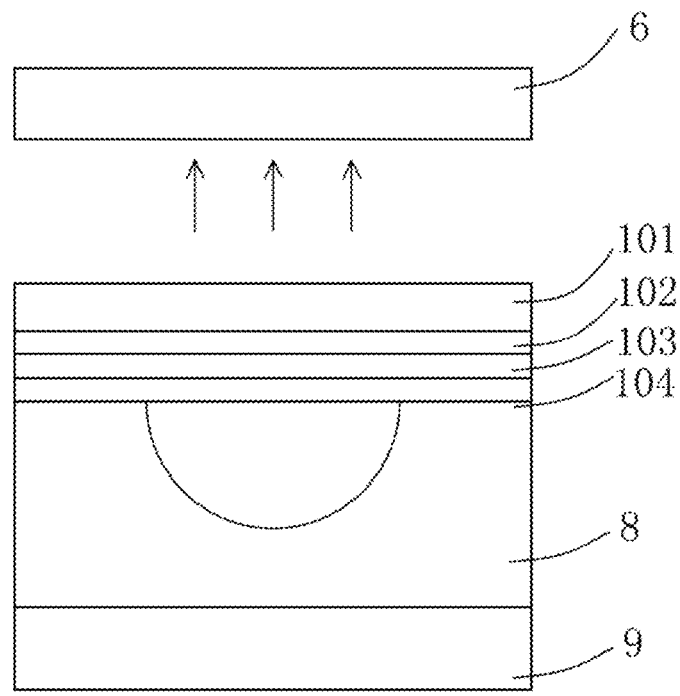
FIG. 7 is a schematic structural diagram of stripping the substrate during performing a method for manufacturing the spherical flip-chip micro-LED of the disclosure.
Figure 8:
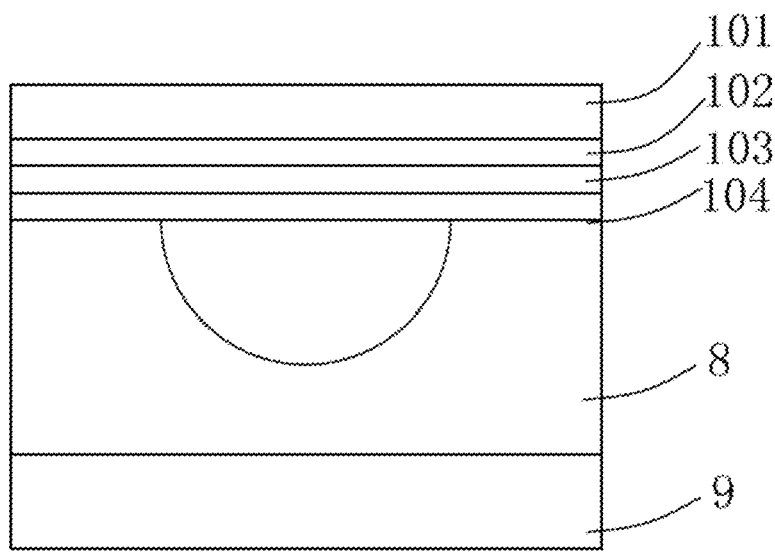
FIG. 8 is a schematic structural diagram when the substrate is stripped during performing a method for manufacturing the spherical flip-chip micro-LED of the disclosure.
Figure 9:
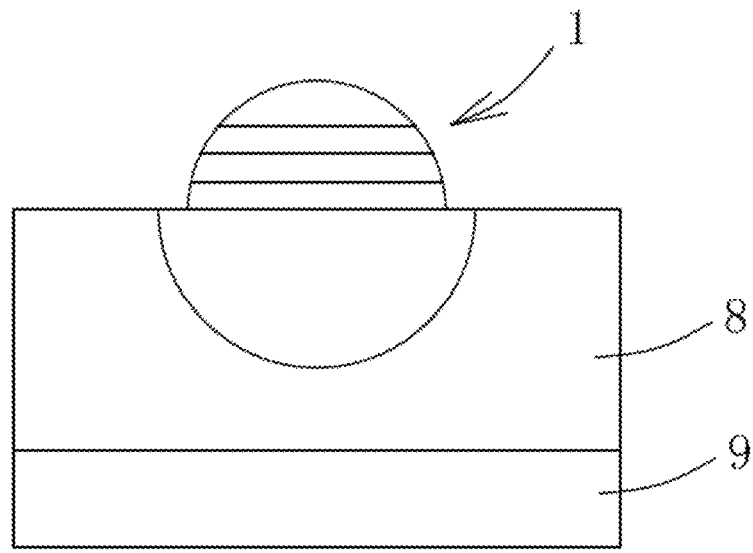
FIG. 9 is a schematic diagram of etching the light-emitting structure layer into a hemispherical structure during performing a method for manufacturing the spherical flip-chip micro-LED of the disclosure.

As illustrated in FIG. 6, the light-emitting structure layer 108 and the supporting structure layer 201 as a whole are flipped over and placed on the bonding material 8 and the bonding substrate 9. As illustrated in FIGS. 7 and 8, the substrate 6 is stripped so as to expose the light-emitting structure layer 108. As illustrated in FIG. 9, the light-emitting structure layer 108 is then etched into a second hemisphere, so as to obtain the light-emitting body 1.

Figure 10:
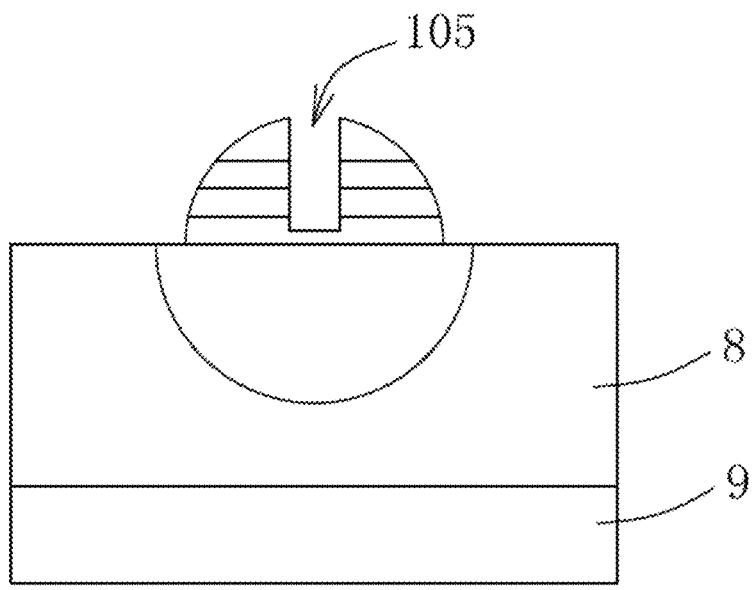
FIG. 10 is a schematic structural diagram of etching to obtain an electrode accommodating through hole during performing a method for manufacturing the spherical flip-chip micro-LED of the disclosure.
Figure 11:
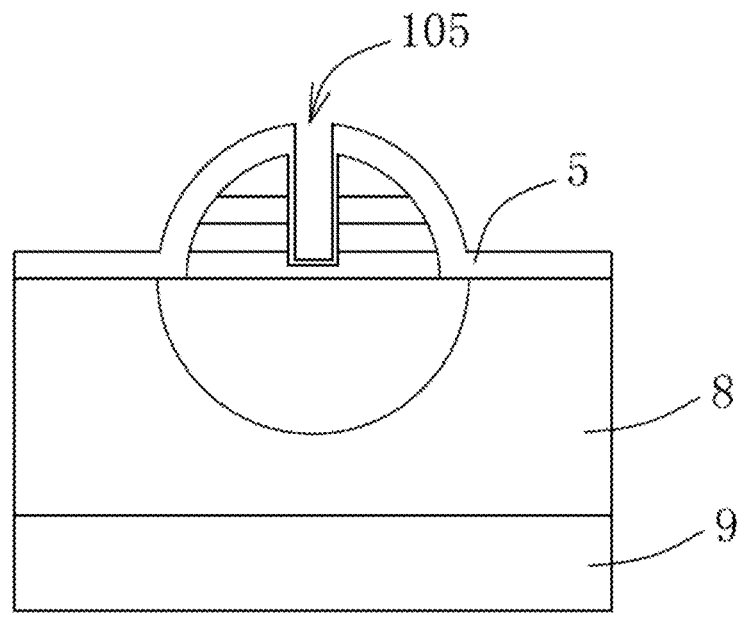
FIG. 11 is a schematic structural diagram of depositing an insulating protective layer during performing a method for manufacturing the spherical flip-chip micro-LED of the disclosure.
Figure 12:
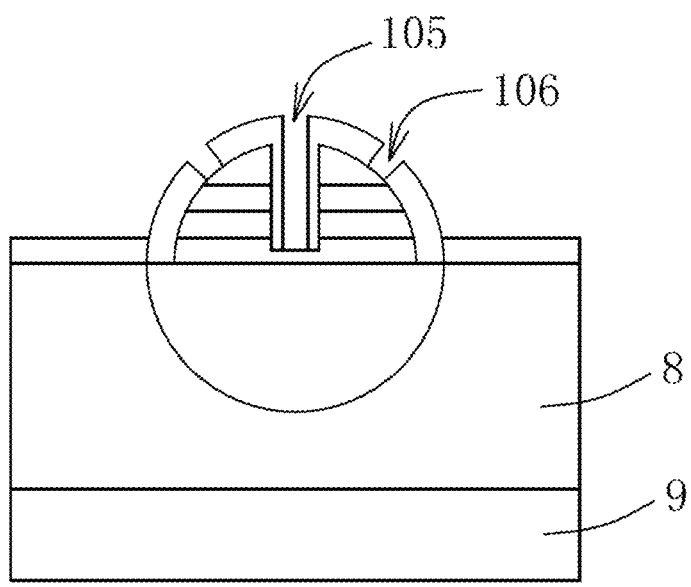
FIG. 12 is a schematic structural diagram of patterning the insulating protective layer during performing a method for manufacturing the spherical flip-chip micro-LED of the disclosure.
Figure 13:
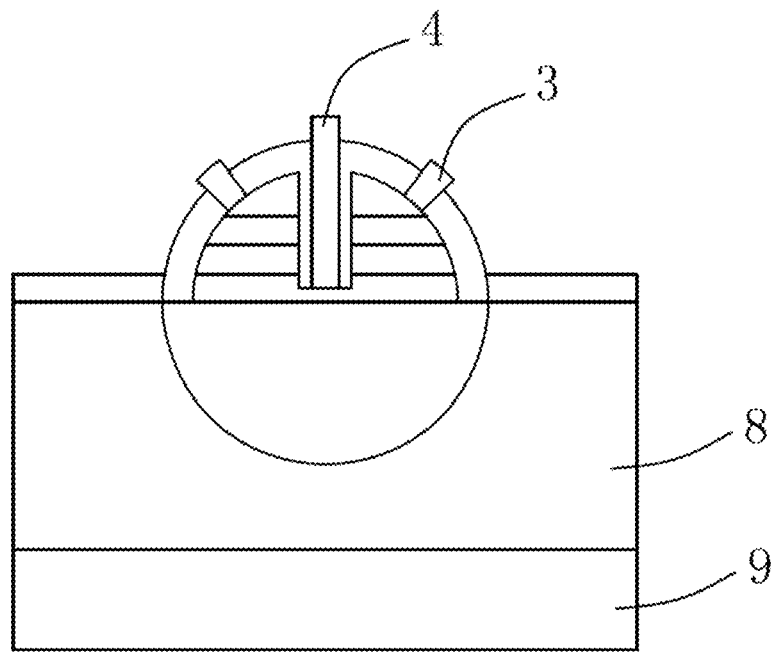
FIG. 13 is a schematic structural diagram of depositing the first electrode and the second electrode during performing a method for manufacturing the spherical flip-chip micro-LED of the disclosure.

As illustrated in FIG. 10, the light-emitting body 1 is etched to obtain the electrode accommodating through hole 105. The electrode accommodating through hole 105 extends through the first semiconductor layer 101, the light-emitting layer 102, and the second semiconductor layer 103. As illustrated in FIG. 11, the insulating protective layer 5 is then deposited. In an implementation, the insulating protective layer 5 is provided with the DBR structure to improve luminous efficiency. As illustrated in FIG. 12, the insulating protective layer 5 is patterned. A part of the insulating protective layer 5 in the electrode accommodating through hole 105 that is used to be in contact with the ITO current spreading layer 104 is etched away, and the electrode accommodating window 106 is formed by etching. As illustrated in FIG. 13, the first electrode 3 is deposited in the electrode accommodating window 106, and the second electrode 4 is deposited in the electrode accommodating through hole 105. Finally, the bonding substrate 9 is stripped to form the spherical flip-chip micro-LED as illustrated in FIG. 1.

In an implementation, as illustrated in FIGS. 14 to 17, the supporting body 2 is etched into the first hemisphere as follows.

Figure 14:
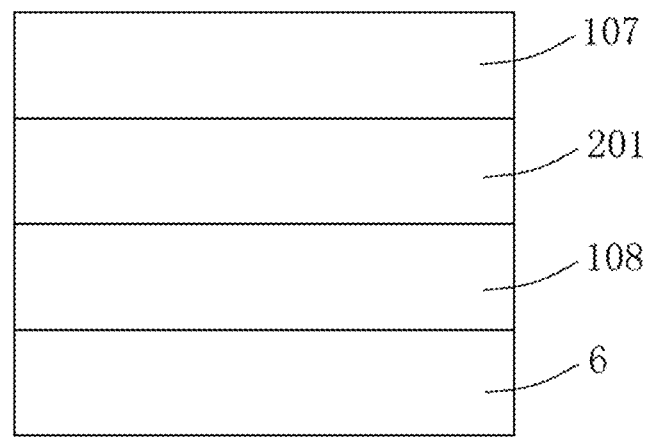
FIG. 14 is a schematic structural diagram of forming a mask layer on the supporting structure layer during performing a method for manufacturing the spherical flip-chip micro-LED of the disclosure.
Figure 15:
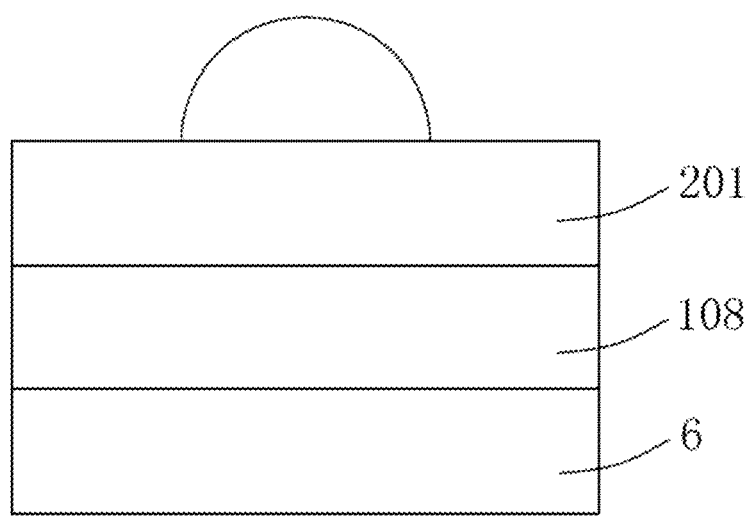
FIG. 15 is a schematic structural diagram of patterning the mask layer during performing a method for manufacturing the spherical flip-chip micro-LED of the disclosure.

As illustrated in FIG. 14, a mask layer 107 is formed on the supporting structure layer 201. As illustrated in FIG. 15, the mask layer 107 is patterned into a hemispherical or semi-ellipsoidal shape. The actual pattern of the mask layer 107 is adjusted according to the dry etching process parameters.

Figure 16:
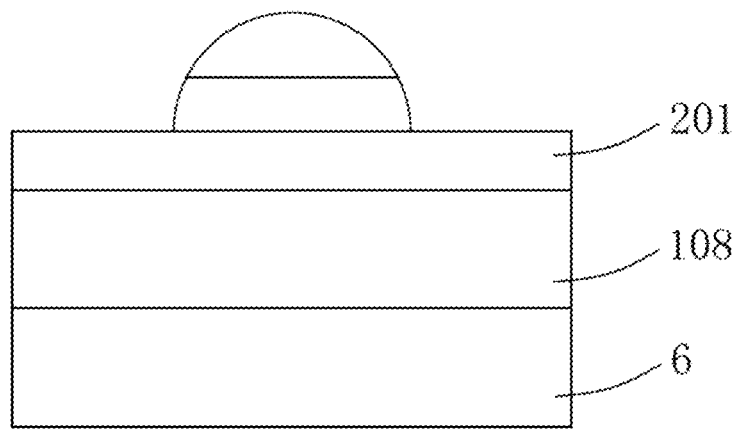
FIG. 16 is a schematic structural diagram of etching with the assistance of the mask layer during performing a method for manufacturing the spherical flip-chip micro-LED of the disclosure.
Figure 17:
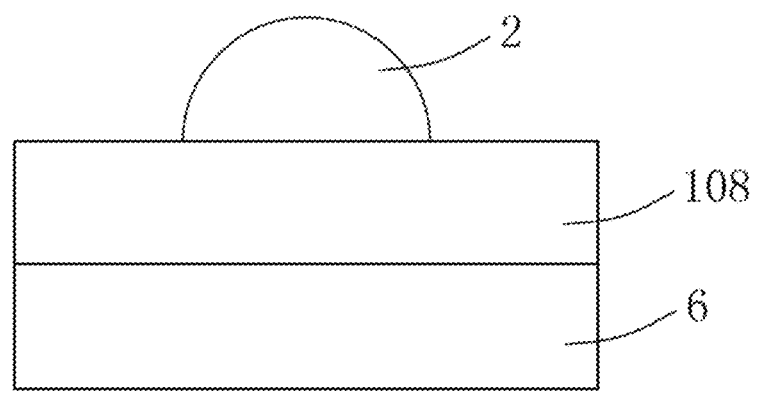
FIG. 17 is a schematic diagram of forming a hemispherical structure on the supporting body during performing a method for manufacturing the spherical flip-chip micro-LED of the disclosure.

As illustrated in FIG. 16, the etching process is performed until the mask layer 107 illustrated in FIG. 14 is etched away. As illustrated in FIG. 17, the supporting body 2 is formed into a hemispherical structure.

As illustrated in FIGS. 18-23, a display panel includes a backplane 7 and multiple spherical flip-chip micro-LEDs arranged on the backplane 7. The backplane 7 is provided with a first connection wire 704 and a second connection wire 705. The first electrode 3 of the spherical flip-chip micro-LED is electrically coupled to the first connection wire 704, and the second electrode 4 of the spherical flip-chip micro-LED is electrically coupled to the second connection wire 705.

Figure 18:
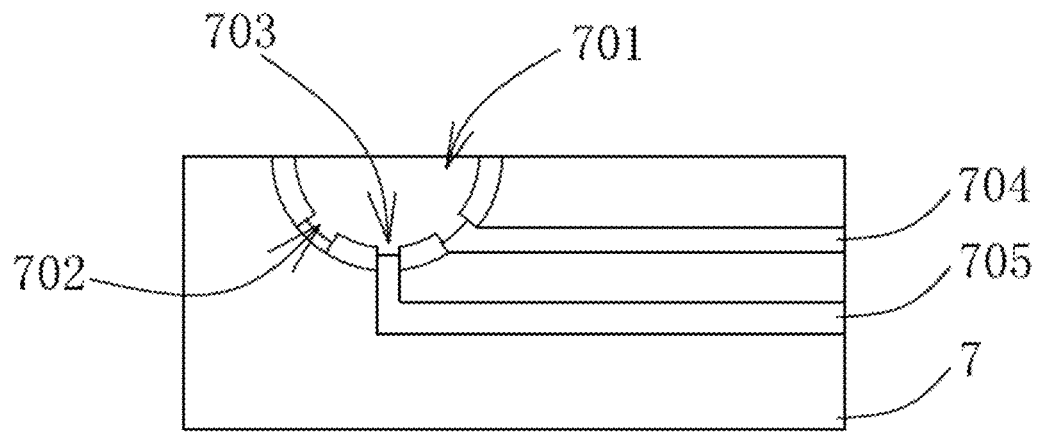
FIG. 18 is a side view of a backplane in a display panel of the disclosure.

As illustrated in FIG. 18, the backplane defines multiple loading wells 701 thereon, and each of the multiple loading wells 701 matches the spherical flip-chip micro-LED and is provided with a magnetic metal pad matching the second electrode 4 therein. When the multiple spherical flip-chip micro-LEDs are fixed in the loading wells 701 on the backplane 7, a micro LED array can be formed.

In an implementation, the second electrode 4 is made of a magnetic material. Alternatively, a part of a surface of the second electrode 4 is coated with a magnetic material. Correspondingly, the magnetic metal pad is provided in the loading well 701. The magnetic polarity of the second electrode 4 is opposite to that of the magnetic metal pad provided in the loading well 701. Through a magnetic force between the second electrode 4 and the magnetic metal pad, it is convenient to attach the spherical flip-chip micro-LED to the loading well 701 during the transfer process, and it can ensure the effective contact between the second electrode 4 and the magnetic metal pad.

Figure 19:
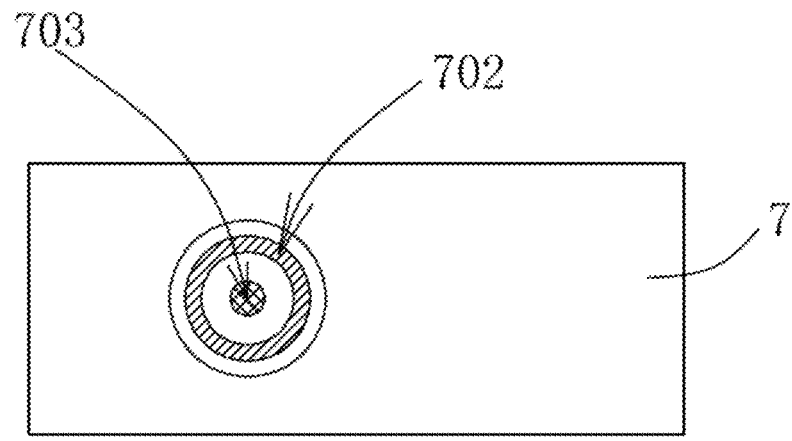
FIG. 19 is a top view of the backplane in the display panel of the disclosure.
Figure 20:
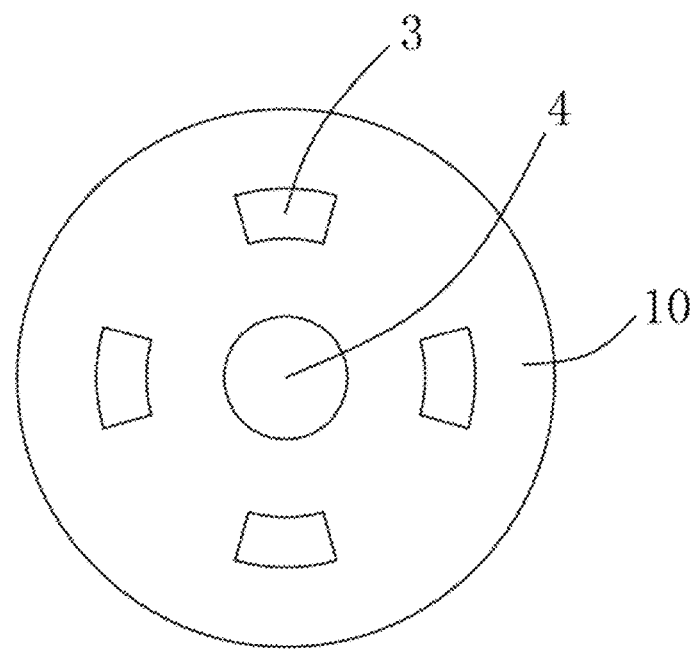
FIG. 20 is a bottom view of the spherical flip-chip micro-LED in the display panel of the disclosure.

As illustrated in FIG. 19 and FIG. 20, in order to achieve a more effective electrical connection between the spherical flip-chip micro-LED 10 and the backplane 7, an end of the first electrode 3 exposed outside a surface of the hemispherical structure and an end of the second electrode 4 exposed outside the surface of the hemispherical structure are provided with a hot-melt conductive material. Correspondingly, each of the multiple loading wells 701 defines a first metal channel 702 corresponding to the first electrode 3 and a second metal channel 703 corresponding to the second electrode 4. During loading, the first electrode 3 is disposed in the first metal channel 702, and the second electrode 4 is disposed in the second metal channel 703.

The components in the display panel of the disclosure, such as the first electrode 3, the second electrode 4, the first connection wire 704, the second connection wire 705, the loading well 701, the first metal channel 702, the second metal channel 703, and the magnetic metal pad are all for effective electrical coupling between the spherical flip-chip micro-LED 10 and the backplane 7. The first connection wire 704 and the second connection wire 705 are built in the backplane 7. The first metal channel 702 and the second metal channel 703 are formed in the loading well 701. The first connection wire 704 and the second connection wire 705 are exposed outside the first metal channel 702 and the second metal channel 703. When loading, the first electrode 3 is sleeved in the first metal channel 702 to be electrically coupled to the first connection wire 704, and the second electrode 4 is sleeved in the second metal channel 703 to be electrically coupled to the second connection wire 705. In particular, the magnetic metal pad is also provided in the loading well 701, which is used for more precise mass transfer by magnetic force.

In order to facilitate the bonding of spherical flip-chip micro-LEDs, the first metal channel 702 has a depth which is less than a thickness of a part of the first electrode 3 which is exposed outside the surface of the hemispherical structure, and greater than a thickness of the hot-melt conductive material on the first electrode 3. Correspondingly, the second metal channel 703 has a depth which is less than a thickness of a part of the second electrode 4 which is exposed outside of the surface of the hemispherical structure, and greater than a thickness of the hot-melt conductive material on the second electrode 4.

The thickness of the first electrode 3 of the part of the first electrode 3 (i.e., a protruding part of the first electrode 3 itself) which is exposed outside the surface of the hemispherical structure plus the thickness of the hot-melt conductive material on the first electrode 3 to obtain a thickness of a total protruding part. The thickness of the total protruding part is greater than the depth of the first metal channel 702, so that the hot-melt conductive material on the first electrode 3 and the first electrode 3 can be in contact with first connection wire 704. In addition, the first metal channel 702 is greater than the thickness of the hot-melt conductive material on the first electrode 3, which can prevent the hot-melt conductive material from overflowing after melting, thereby avoiding short-circuiting.

As illustrated in FIG. 19 and FIG. 20, in an implementation, in order to further prevent a short circuit between the first electrode 3 and the second electrode 4 due to overflowing of the hot-melt conductive material on the first electrode 3 out of the first metal channel 702 when the spherical flip-chip micro-LED is bonded to the backplane 7, the first electrode 3 has multiple non-continuous protrusions. Correspondingly, the first metal channel 702 is a continuous annular metal channel. During bonding the spherical flip-chip micro-LEDs 10, the excess hot-melt conductive material can flow into spaces between the non-continuous protrusions of the first electrode 3.

Figure 23:
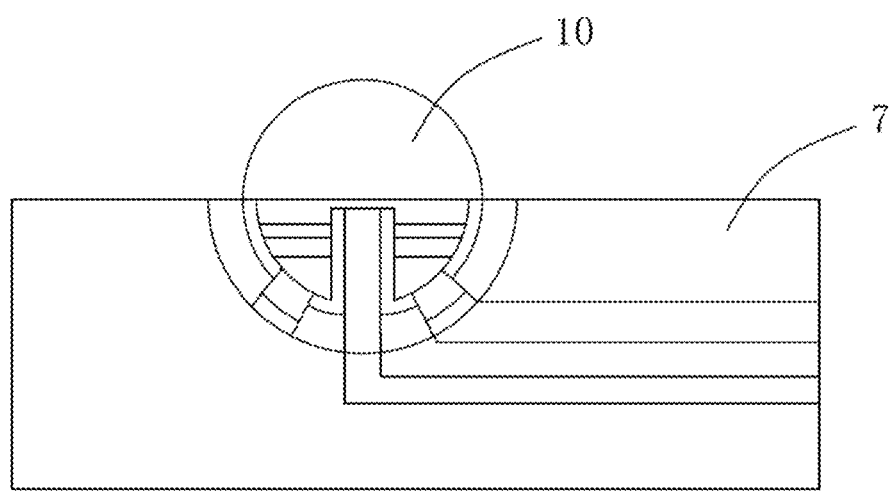
FIG. 23 is a schematic structural diagram of the display panel after the mass transfer is completed of the disclosure.

As illustrated in FIGS. 21 and 22, during assembling spliced display panels, a large number of spherical flip-chip micro-LEDs 10 are placed in a liquid environment to obtain a suspension, and the magnetic metal pad is provided in the loading well 701 on the backplane 7. Since the density of the light-emitting body 1 of the spherical flip-chip micro-LED 10 is greater than that of the supporting body 2, when the spherical flip-chip micro-LED 10 in the suspension falls on the backplane 7, the light-emitting body 1 provided with electrodes of the spherical flip-chip micro-LED 10 can face downward. When the suspension flows slowly along a horizontal direction, the hemispherical structure formed by the light-emitting body 1 which is provided with the first electrode 3 and the second electrode 4 will accurately fall into the loading well 701 of the backplane 7. After the massive transfer is completed, the structure of backplane 7 and spherical flip-chip micro-LED 10 is illustrated in FIG. 23.

A transfer method for forming a micro LED display panel is provided, which includes the following.

Firstly, multiple spherical flip-chip micro-LEDs are placed in the suspension. Since the density of the light-emitting body 1 is greater than that of the supporting body 2, the light-emitting body 1 of the spherical flip-chip micro-LED in the suspension where the first electrode 3 and the second electrode 4 are located will face downward.

Secondly, the backplane 7 is placed in the suspension to allow the spherical flip-chip micro-LEDs float above the backplane 7. Multiple loading wells 701 are provided on the backplane 7, and the multiple loading wells 701 form a loading well array. Each of the multiple loading wells 701 is provided with the magnetic metal pad. The second electrode 4 is made of a magnetic conductive material. The magnetism of the second electrode 4 is opposite to that of the magnetic metal pad provided in the loading well 701.

Thirdly, the spherical flip-chip micro-LED is adsorbed in the loading well 701 by the magnetic force between the second electrode 4 and the magnetic metal pad to form a micro LED array, so as to complete the mass transfer.

It is noted that the above is only the process of transferring the spherical flip-chip micro-LEDs to the backplane 7, and does not include a packaging process. It needs to be further packaged to form a monolithic micro LED display panel.

A large number of spherical flip-chip micro-LEDs are placed in the suspension so that the light-emitting body 1 where the first electrode 3 and second electrode 4 are located will face downward. There are magnetic metal pads disposed on the backplane 7. The magnetic metal pad has the opposite magnetism to the second electrode 4. The spherical flip-chip micro-LED is adsorbed in the loading well 701 through magnetic forces, so that the spherical flip-chip micro-LED is accurately aligned to the loading well 701 of the backplane 7. There are two ways to realize the magnetic metal pad, one is to use magnetic material to form the magnetic metal pad and there is direct magnetic force, the other one is to use electromagnetic induction to generate magnetic force after power-on. When the suspension is flowing, the second electrode 4 and the second metal pad are attracted to each other through the adsorption of the magnetic electrode to complete the massive transfer.

In summary, a spherical flip-chip micro-LED, a method for manufacturing the spherical flip-chip micro-LED, and a display panel are provided. The spherical flip-chip micro-LED includes a light-emitting body 1, a supporting body 2, a first electrode 3, a second electrode 4, and an insulating protective layer 5. The supporting body 2 is transparent. The first electrode 3 and the second electrode 4 are electrically coupled with the light-emitting body 1. The insulating protective layer 5 covers surfaces of the light-emitting body 1 and/or the supporting body 2. The light-emitting body 1, the supporting body 2, and the insulating protective layer 5 form a spherical structure. Compared with the related art, the technical solution of the disclosure has the following beneficial effects. In addition to the light-emitting body 1, the transparent supporting body 2 is further provided. The light-emitting body 1, the supporting body 2, and the insulating protective layer 5 form a spherical structure with a predetermined size, the normal light emission of the spherical flip-chip micro-LED is also ensured.

It is noted that the disclosure is not limited to the above examples. For those of ordinary skill in the art, improvements or changes can be made based on the above description, and all these improvements and changes should fall within the protection scope of the claims of the disclosure.

What is claimed is:

1. A spherical flip-chip micro-LED, comprising:
   a light-emitting body;
   a supporting body being transparent;
   a first electrode and a second electrode which are electrically coupled with the light-emitting body; and
   an insulating protective layer covering the light-emitting body, wherein the light-emitting body, the supporting body, and the insulating protective layer form a spherical structure.

2. The spherical flip-chip micro-LED of claim 1, wherein the light-emitting body has a density greater than the supporting body.

3. The spherical flip-chip micro-LED of claim 1, wherein the light-emitting body comprises a first semiconductor layer, a second semiconductor layer, a light-emitting layer sandwiched between the first semiconductor layer and the second semiconductor layer; and
   the first electrode is electrically coupled with the first semiconductor layer, the second electrode is electrically coupled with the second semiconductor layer.

4. The spherical flip-chip micro-LED of claim 3, wherein the light-emitting body further comprises an indium tin oxide (ITO) current spreading layer, the ITO current spreading layer being disposed between the second semiconductor layer and the supporting body; and
   the first electrode is electrically connected with the first semiconductor layer, the second electrode is electrically coupled with the second semiconductor layer via the ITO current spreading layer.

5. The spherical flip-chip micro-LED of claim 4, wherein the first semiconductor layer, the light-emitting layer, the second semiconductor layer, and the ITO current spreading layer form a hemispherical structure, the supporting body is a hemispherical structure;

the first semiconductor layer, the light-emitting layer, and the second semiconductor layer defines an electrode accommodating through hole which extends through and is perpendicular to the first semiconductor layer, the light-emitting layer, and the second semiconductor layer;

the second electrode is disposed in the electrode accommodating through hole, and has one end electrically coupled to the ITO current spreading layer and the other end is exposed outside a surface of the hemispherical structure formed by the light-emitting body;

an insulating protective layer is covered on outer surfaces of the first semiconductor layer, the light-emitting layer, the second semiconductor layer, and the ITO current spreading layer, and is covered on an inner surface of the electrode accommodating through hole; and the insulating protective layer defines an electrode accommodating window thereon, wherein the first electrode is disposed in the electrode accommodating window, and has one end electrically coupled to the first semiconductor layer and the other end is exposed outside the surface of the hemispherical structure formed by the light-emitting body.

6. The spherical flip-chip micro-LED of claim 5, wherein an end of the first electrode exposed outside the surface of the hemispherical structure and an end of the second electrode exposed outside the surface of the hemispherical structure are provided with a hot-melt conductive material.

7. The spherical flip-chip micro-LED of claim 1, wherein the second electrode is made of a magnetic material.

8. The spherical flip-chip micro-LED of claim 1, wherein a part of a surface of the second electrode is coated with a magnetic material.

9. The spherical flip-chip micro-LED of claim 1, wherein the supporting body is made of $SiO_2$ or transparent solid resin.

10. A method for manufacturing a spherical flip-chip micro-LED, comprising:
   forming sequentially a light-emitting structure layer and a supporting structure layer on a substrate;
   etching the supporting structure layer to obtain a supporting body, wherein the supporting body is a hemispherical structure and transparent;
   flipping over and stripping the substrate, and etching the light-emitting structure layer into a hemispherical structure;
   perforating the hemispherical structure formed by the light-emitting structure layer to form an electrode accommodating through hole;
   depositing an insulating protective layer which is covered on an outer surface of the light-emitting structure layer and an inner surface of the electrode accommodating through hole;
   etching the insulating protective layer to form an electrode accommodating window; and
   depositing a first electrode and a second electrode.

11. A display panel, comprising:
   a backplane, provided with a first connection wire and a second connection wire; and
   a spherical flip-chip micro-LED of claim 1, wherein the first electrode of the spherical flip-chip micro-LED is electrically coupled to the first connecting wire, the second electrode of the spherical flip-chip micro-LED is electrically coupled to the second connecting wire.

12. The display panel of claim 11, wherein
the backplane defines a plurality of loading wells thereon, and each of the plurality of loading wells matches the spherical flip-chip micro-LED and is provided with a magnetic metal pad matching the second electrode therein.

13. The display panel of claim 12, wherein
an end of the first electrode exposed outside a surface of the hemispherical structure and an end of the second electrode exposed outside the surface of the hemispherical structure are provided with a hot-melt conductive material; and each of the plurality of loading wells defines a first metal channel corresponding to the first electrode and a second metal channel corresponding to the second electrode, the first electrode is disposed in the first metal channel, and the second electrode is disposed in the second metal channel.

14. The display panel of claim 13, wherein
the first metal channel has a depth which is less than a thickness of a part of the first electrode which is exposed outside the surface of the hemispherical structure, and greater than a thickness of the hot-melt conductive material on the first electrode; and the second metal channel has a depth which is less than a thickness of a part of the second electrode which is exposed outside of the surface of the hemispherical structure, and greater than a thickness of the hot-melt conductive material on the second electrode.

15. The display panel of claim 14, wherein the first electrode has a plurality of non-continuous protrusions, the first metal channel is a continuous annular metal channel.

16. The display panel of claim 13, wherein
the first connection wire and the second connection wire are disposed in the backplane;
the first metal channel and the second metal channel are disposed in the loading well; and
the first connection wire is exposed outside the first metal channel and the second connection wire is exposed outside the second metal channel.

* * * * *